(12) United States Patent
Jelonnek

(10) Patent No.: US 7,015,843 B2
(45) Date of Patent: Mar. 21, 2006

(54) SIGMA-DELTA CONVERTER WITH NOISE SUPPRESSION

(76) Inventor: Björn Jelonnek, Rohrweg 28, D-89079 Ulm (DE)

( * ) Notice: Subject to any disclaimer, the term of this patent is extended or adjusted under 35 U.S.C. 154(b) by 23 days.

(21) Appl. No.: 10/499,519

(22) PCT Filed: Dec. 19, 2002

(86) PCT No.: PCT/EP02/14597

§ 371 (c)(1),
(2), (4) Date: Jun. 21, 2004

(87) PCT Pub. No.: WO03/052938

PCT Pub. Date: Jun. 26, 2003

(65) Prior Publication Data

US 2005/0062627 A1    Mar. 24, 2005

(30) Foreign Application Priority Data

Dec. 19, 2001 (EP) .................................. 01130333

(51) Int. Cl.
*H03M 3/00* (2006.01)
(52) U.S. Cl. ........................................ 341/143; 341/159
(58) Field of Classification Search ................ 341/143, 341/144, 155, 159
See application file for complete search history.

(56) References Cited

U.S. PATENT DOCUMENTS

| | | | | |
|---|---|---|---|---|
| 6,519,773 B1 * | 2/2003 | Ahmed et al. | .............. | 725/118 |
| 6,741,197 B1 * | 5/2004 | Melanson | .................... | 341/150 |
| 6,822,593 B1 * | 11/2004 | Level et al. | ................ | 341/143 |
| 6,873,280 B1 * | 3/2005 | Robinson et al. | ........... | 341/159 |
| 2004/0190660 A1 * | 9/2004 | Morris et al. | ............... | 375/350 |
| 2005/0017802 A1 * | 1/2005 | Robinson | .................... | 330/151 |

FOREIGN PATENT DOCUMENTS

| | | | |
|---|---|---|---|
| DE | 1168632 | * | 6/2000 |
| DE | 199 37 246 | | 3/2001 |
| WO | 98/48515 | | 10/1998 |

OTHER PUBLICATIONS

Steven R. Norsworthy et al.; Delta-Sigma Data Converters: Theory Design, and Simulation, IEEE Press, 1996, pp. i-xxiii and 1-476, no date.

* cited by examiner

*Primary Examiner*—Peguy JeanPierre
(74) *Attorney, Agent, or Firm*—Staas & Halsey LLP

(57) ABSTRACT

A digital input signal passes through a principal path, containing at least one sigma-delta modulator having a transmission function and a digital-to-analog converter, and at least one parallel path, connected in parallel to the principal path and having at least one sigma-delta modulator and a digital-to-analog converter. The sigma-delta converter produces an analog output signal by summing the analog output signals of the principal and parallel paths. A differential signal from which at least the noise outside a useful band has been filtered is obtained from the digital output signal of the sigma-delta modulator of the principal path and the input signal that has been spectrally formed by a filter, according to the transmission function of the sigma-delta modulator in the principal path. This differential signal is supplied as the input signal to the sigma-delta modulator in the parallel path(s).

17 Claims, 4 Drawing Sheets

SIGMA-DELTA CONVERTER WITH NOISE SUPPRESSION

This application is a 371 of PCT/EP02/14597

CROSS REFERENCE TO RELATED APPLICATIONS

This application is based on and hereby claims priority to European Patent Application No. 01130333.6 filed on Dec. 19, 2001, the contents of which are hereby incorporated by reference.

BACKGROUND OF THE INVENTION

1. Field of the Invention

The invention relates to a sigma-delta converter for converting a digital input signal into an analog output signal.

2. Description of the Related Art

In digital to analog converters, as employed in digital radio communication reception devices for example, a digital input signal with $2^N$ signal states and a fixed sampling frequency $f_a$ is usually transposed into an analog signal which should match the digital signal as well as possible in the frequency range $-f_a/2$ to $+f_a/2$.

In the case of high bit widths N in particular, the quantity of signal states to be implemented by analog circuit technology represents a fundamental problem since the $2^N$ signal states are more and more difficult to discriminate from the quantization noise as their quantity increases. Consequently, the digital signal is interpolated by digital filters and what are referred to as sigma-delta modulators are employed which substantially reduce the bit width of the digital signal in the case of an increased sampling frequency and transform the accordingly increased quantization noise into previously unused frequency ranges. Structures of sigma-delta modulators which achieve shaping of the noise signal like that by higher-order IIR filters (Infinite Impulse Response filters) are particularly efficient in this respect. Digital to analog converters are connected on the outgoing circuit side of the sigma-delta modulators which convert the digital output signal of the sigma-delta modulators into an analog signal. Together, sigma-delta modulators and digital to analog converters produce what is referred to as the sigma-delta converter.

There are two approaches to achieving noise shaping in the case of sigma-delta modulators.

According to the first approach, higher-order feedback loops are employed which allow a reduction of the number of stages to up to two signal states. A disadvantageous effect is that the noise shaping results in possible instabilities in the case of high input signals with effect from the 3rd order.

According to the second approach, first-order and/or second-order cascade-connected structures are employed which are multi-stage and accordingly display stable operational behavior.

A detailed depiction of the structure and mode of functioning of sigma-delta modulators is given by S. R. Norsworthy, R. Schreier and G. Temes: *"Delta-Sigma Converters, Theorie, Design und Simulation"*, IEEE Press 1997, ISBN 0-7803-1045-4.

A specific cascade-connected structure of a sigma-delta modulator is described in DE 199 37 246. This cascade-connected structure firstly reduces the quantity of signal states and secondly largely guarantees stability even in the case of higher-order sigma-delta modulators.

Sigma-delta converters, where the quantity of signal states has been reduced to two, offer fundamental advantages for implementing the digital to analog converter. Variations in the signal amplitude or a possible direct voltage component in the signal do not affect the linearity of the analog output signal. A disadvantage, however, is the necessary high oversampling factor (the ratio of the useful bandwidth to the sampling rate of the sigma-delta converter) onto which the baseband signal has to be interpolated so that a certain signal-to-noise ratio can be ensured in the useful band.

If multi-stage sigma-delta converters are used in place of two-stage ones, then substantially smaller oversampling factors can be used in theory. A large number of quantization stages are typically required for this which must all be identically high so that the quantization noise is optimized. As described in *"Delta-Sigma-Data-Converters, Theorie, Design and Simulation"*, 1996, by S. R. Norsworthy, R. Schreier and G. Temes for example, this problem is solved by employing a large number of two-stage digital to analog converters. A specific scrambling algorithm after the actual sigma-delta converter ensures that the data stream of each individual sigma-delta converter is noise-shaped and causes little interference in the useful signal band (noise shaped element usage). The stability of the algorithm is not ensured with effect from the 2nd order. Its cost is relatively high due to the vector quantizer used in this case. Furthermore, the structure of this scrambling algorithm is not linear and it generates feedback, which stands in the way of direct paralleling.

SUMMARY OF THE INVENTION

The present invention therefore arises from an object of finding a structure for a sigma-delta converter which requires only a few two-stage sigma-delta converters in the case of the given low oversampling factor with a high signal-to-noise ratio (SNR), where the structure of the sigma-delta converter should be parallelable.

According to the invention, each parallel path is configured in such a way that the input signal of the sigma-delta modulator in the parallel path constitutes the differential signal, filtered to exclude at least the noise components outside the useful band, resulting from the digital output signal of the sigma-delta modulator in the principal path and the input signal x(k) which has been spectrally shaped by a filter in accordance with the transmission function of the sigma-delta modulator in the principal path.

The spectral shaping of the input signal x(k) in accordance with the transmission function of the sigma-delta modulator in the principal path and the subsequent differential formation with the digital output signal of the sigma-delta modulator essentially isolates the quantization errors of the sigma-delta modulator in the principal path. The subsequent filtering then attenuates the noise components outside the useful band which represent the fundamental components of the noise power. This structure of a sigma-delta converter overlays the signal components of the principal and parallel paths constructively, while the noise components of the two paths are overlaid destructively. As a result, the quantization noise of the sigma-delta converters can be compensated for at least partly. This parallel circuit functions without feedback paths.

In a development of the invention, at least one parallel path is configured in such a way that the digital signal is amplified immediately before the sigma-delta modulator.

If the fundamental components of the noise power are suppressed, the amplitude of the signal can be increased without the sigma-delta modulator being overdriven.

In a development of the invention, at least one parallel path is configured in such a way that the converted signal is attenuated after digital to analog conversion of the modulated signal and before the formation of the total signal. The attenuation of the analog signal is guided by the preceding digital amplification. Noise signal components in the analog output signal of the digital to analog converter in the principal path are therefore compensated for. In place of explicit attenuation of the analog signal, a digital to analog converter with a lower output power can be employed as an alternative.

In a development of the invention, at least one parallel path is configured in such a way that there is a temporal delay of the input signal $x(k)$ for balancing out propagation time differences with respect to the principal path. Propagation time differences can arise particularly due to different processing times of digital components such as filters, sigma-delta modulators and the like. The delay elements compensate for the propagation times in the individual cascade stages.

In a development of the invention, the principal path is configured in such a way that compensation filtering is provided after the branch to the parallel path and before the digital to analog conversion. The compensation filtering in the principal path can compensate for the propagation times and the frequency responses in the parallel path which contains a filter, an amplifier and a sigma-delta converter. This additional filter can compensate for error components in the parallel path.

The sigma-delta converter in the principal path is advantageously configured as a multi-stage sigma-delta converter. In multi-stage sigma-delta converters, the principle of the onward transfer of the quantization noise can be exploited with the result that the quantization noise of the individual stages is overlaid destructively, that is to say the noise component of the overall sigma-delta converter does not increase directly proportionally to the number of stages of the multi-stage sigma-delta converter, but less than proportionally. Moreover, the use of multi-stage sigma-delta converters makes it possible to combine different properties in different stages.

If the multi-stage sigma-delta converter in the principal path is configured by the principal path and at least one cascade stage, where each cascade stage constitutes a parallel path, the quantization noise of the individual cascade stages can be compensated for in a particularly advantageous manner.

In a development of the invention, for n>1 cascade stages and each cascade stage i where 2 i n, the cascade stage i–1 is connected in parallel in such a way that the cascade stage i–1 assumes the function of the principal path for the cascade stage i, where an input signal $x(k)$ matched to the principal path by time delay is additionally added to the input signal of the sigma-delta modulator of each cascade stage, where the noise-filtered signal of the cascade stage i–1 is additionally added to the input signal of the sigma-delta modulator of the cascade stage i, and where the digital output signal for the differential formation of the multi-stage sigma-delta modulator constitutes the total signal of the output signals of all sigma-delta modulators of the multi-stage sigma-delta modulator. This structure of a multi-stage sigma-delta converter compensates for the in-band noise signal components of all sigma-delta modulators except for that of the last cascade stage. Only the quantization noise of the sigma-delta modulator of the last cascade stage and the constructively overlaid total signal of all signal components remains in the useful band.

The multi-stage sigma-delta modulator in the principal path advantageously possesses sigma-delta modulators with linear-phase frequency responses with an absolute frequency response of 1. As a rule, spectral noise shaping of the useful signal can be omitted as a result since the latter is usually already band-limited in the case of linear-phase frequency responses with an absolute frequency response of 1 (i.e. no amplification or attenuation).

In a development, the multi-stage sigma-delta converter is configured in such a way that a quantity n>1 of sigma-delta converters is connected in parallel in a cascading manner, where the input signal of the sigma-delta modulator of the cascade stage n constitutes the differential signal resulting from the input signal $x(k)$ and the noise-filtered and n-normalized total signal of the output signals of the sigma-delta modulators in the principal path and the cascade stages i where 1<i<n–1, and where the digital output signal of the multi-stage sigma-delta modulator in the principal path used for the differential formation constitutes the total signal of all the output signals of the n sigma-delta modulators of the multi-stage sigma-delta modulator. Alongside the possibility of using the input signal of the sigma-delta modulator of the cascade stage n as such for the differential formation, a preferred possibility is multiplying the input signal of the sigma-delta modulator of the cascade stage n by the quantity n of cascade stages.

The sigma-delta converters are advantageously configured as 1-bit sigma-delta converters where the 1-bit sigma-delta converter and therefore the 1-bit digital to analog converter can possess unequal output powers. With respect to the noise shaping of the multibit sigma-delta output signal generated, this embodiment initially appears to be a disadvantage since the sigma-delta modulators are reliant on the stability limits and control range of a 1-bit sigma-delta modulator. Taking account of unequal output powers (mismatch) of the individual 1-bit digital to analog converters, however, this evaluation is turned around into an advantage: alongside the noise of the multibit sigma-delta output signal generated, the in-band noise now also contains noise components which spectrally shape the 1-bit data streams and are also included in the in-band noise in accordance with the output signal power differences of the individual digital to analog converters. No post-positioned algorithm, which generates a plurality of 1-bit data streams from the multibit signal and which, due to the restriction of reproducing a multibit signal, only achieves sub-optimum noise shaping for each of these individual data streams, is now needed with the proposed structure. Each individual 1-bit data signal is spectrally formed in an optimum manner and guarantees low in-band noise in the case of high mismatching. The principle of noise signal suppression described above now makes it possible to improve the fundamental disadvantage of the sigma-delta modulator the reduced in-band noise signal shaping considerably over and above the amount achievable by the multibit sigma-delta digital to analog converter used up to now.

In a development of the invention, the noise signals of the sigma-delta modulators of the multi-stage sigma-delta modulator are uncorrelated. Additionally, uncorrelated stochastic signals can be added to the input signals of the sigma-delta modulators of the multi-stage sigma-delta modulator. As a result, interference lines arising in the useful band in the case of certain signals, in which the noise power of the closer environment is concentrated, can be compensated for. To largely suppress this effect, "dither" is added to sigma-delta modulators ("dither" is a stochastic signal which is uncorrelated with the input signal of the sigma-delta converter) which is either added to the input signal of the sigma-delta modulator or is directly established in the decision of the sigma-delta modulator. The "dither" normally reduces the interference lines at the expense of the achievable signal-to-noise ratio of the modulator and is therefore severely limited in amplitude.

With a view to an inexpensive and technically flexible method of manufacture, the sigma-delta converter can be manufactured in CMOS technology (Complementary Metal Oxide Silicon).

The sigma-delta converter according to the invention is outstandingly suitable for use in a radio communication system and particularly in radio communication reception devices.

BRIEF DESCRIPTION OF THE DRAWINGS

These and other objects and advantages of the present invention will become more apparent and more readily appreciated from the following description of exemplary embodiments, taken in conjunction with the accompanying drawings of which.

DETAILED DESCRIPTION OF THE PREFERRED EMBODIMENT

Figure 1:
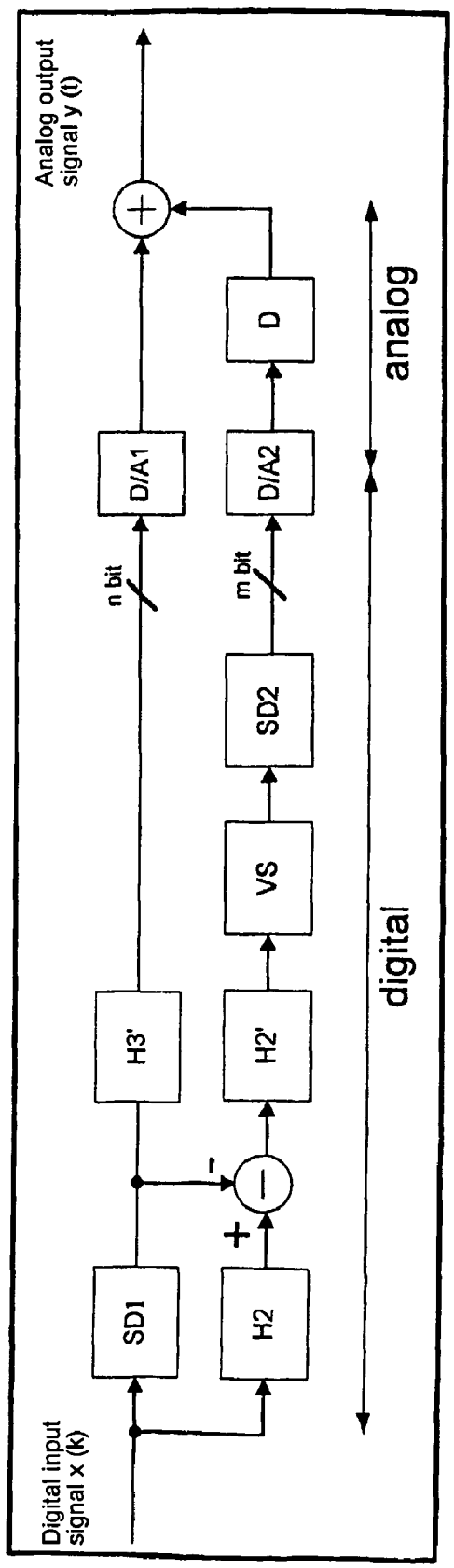
FIG. 1 is a block diagram of the basic principle of a sigma-delta converter with noise suppression according to the invention.

Reference will now be made in detail to the preferred embodiments of the present invention, examples of which are illustrated in the accompanying drawings, wherein like reference numerals refer to like elements throughout.

FIG. 1 shows the basic principle of a sigma-delta converter with noise suppression. A first sigma-delta modulator SD1 in the principal path generates a digital output signal with a bit width restricted to n bits from a digital input signal x(k). Due to this restricted bit width, a quantization error is created which is transformed by the sigma-delta algorithm outside the useful band in accordance with its noise transmission function. Significant noise signal components also fall into the useful band, however, particularly in the case of a low oversampling factor. To suppress these, the digital input signal x(k) is spectrally shaped by a filter H2 in a parallel oath in accordance with the signal transmission function of the first sigma-delta converter SD1 according to the invention. Thereafter, the output signal of the first sigma-delta converter is subtracted from the filtered input signal and so determines the noise signal generated by the quantization error of the sigma-delta modulator SD1. A further filter H2' attenuates the noise signal components outside the useful band. Since these contain the fundamental component of the noise power, the output signal of the filter H2' can be increased by amplifier VS in amplitude without the following sigma-delta modulator 5D2 being overdriven. The additional noise introduced with the limitation to m bit by the sigma-delta modulator 5D2 is therefore lower in amplitude than the amplified noise signal of the sigma-delta modulator SD1. Following the digital to analog conversion DIA2, the analog noise signal is attenuated D in an analog manner in accordance with its previous digital amplification and then compensates for the noise signal component in the analog output signal of the digital to analog converter D/A1. In place of explicit attenuation, a digital to analog converter with a low output power can be employed instead.

The basic principle of the onward transfer of the quantization noise to a further sigma-delta modulator represented in FIG. 1 can also be used for the structure of multi-stage sigma-delta converters. As an application example, the sigma-delta modulator SD1 in FIG. 1 is implemented by three low-stage sigma-delta modulators SD1a, SD1b, SD1c in FIG. 2, where sigma-delta modulator SD1a is in a direct path and sigma-delta modulators SD1b and SD1c are cascade stages. In this respect, the in-band quantization noise of the sigma-delta modulator SD1a is calculated and added to the digital input signal of the sigma-delta modulator SD1b with a negative sign. The combined noise signal of these two sigma-delta modulators is then calculated and then added to the input signal of the sigma-delta modulator SD1c. Delay elements t1, t2, t3, t4, t5 are employed to compensate for the propagation time of the sigma-delta modulators or filters.

Figure 2:
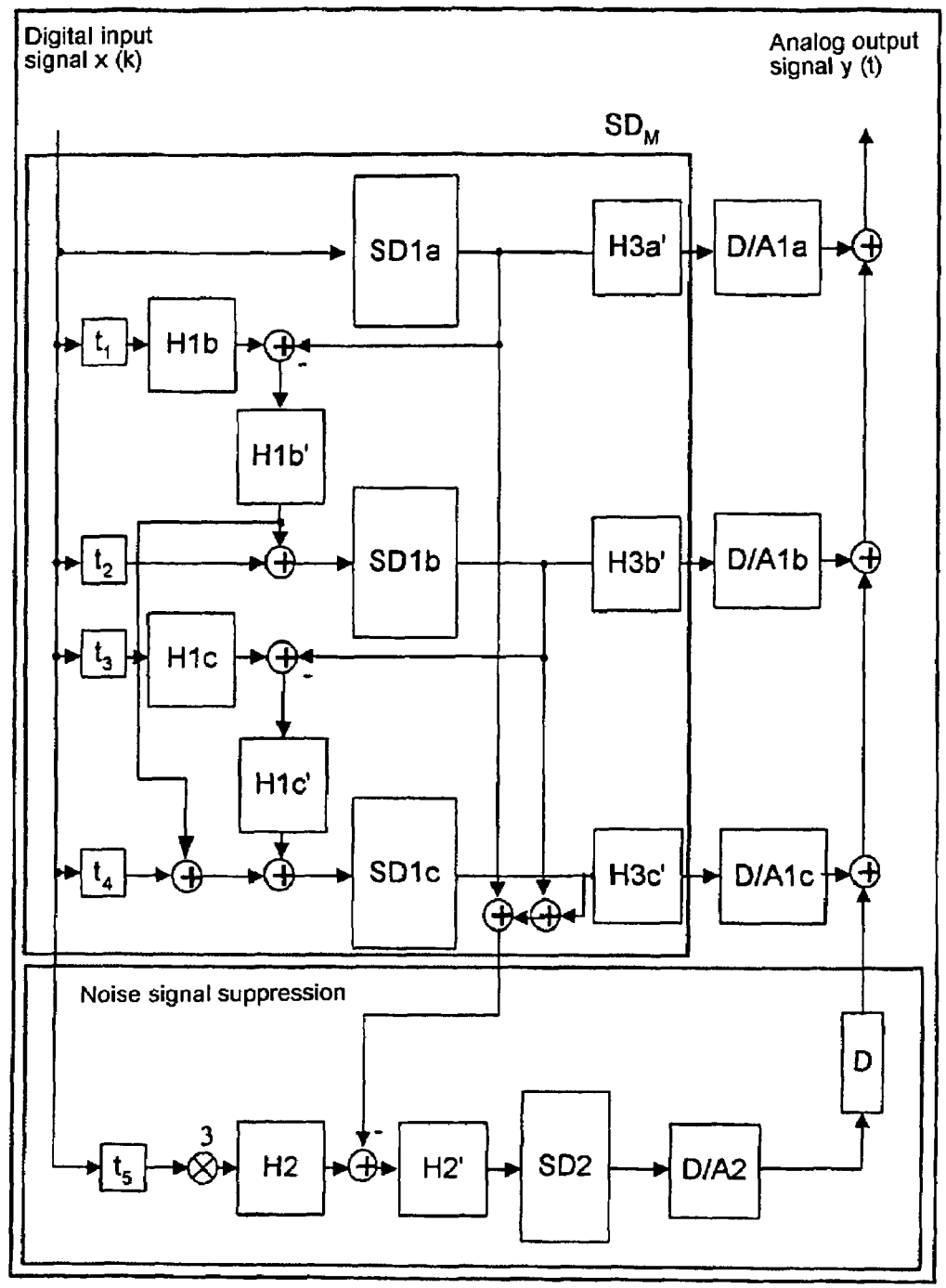
FIG. 2 is a block diagram of a sigma-delta converter with noise signal suppression with a multi-stage sigma-delta converter in the principal path (three cascade-connected sigma-delta modulators) according to one embodiment of the invention.

This approach can be expanded as desired to more sigma-delta modulators and is only restricted to three modulators by way of example in FIG. 2.

If all three output signals of the sigma-delta modulators are joined together, the in-band noise signal components of the first two sigma-delta modulators are compensated for by the corresponding input signal components of the second and third sigma-delta modulators. Only the quantization noise of the third sigma-delta modulator remains in the useful band, whereas all three signal components x(k) are overlaid constructively.

With respect to the noise shaping of the multibit sigma-delta output signal generated, this approach proves to be a disadvantage initially: in the case of the sigma-delta modulator, it is reliant on the stability limits and control range of a 1-bit sigma-delta modulator for example.

Taking account of unequal output powers of the individual 1-bit digital to analog converters (mismatch), however, this evaluation is turned around: alongside the noise of the multibit sigma-delta output signal generated, the in-band noise now also contains noise components which are spectrally shaped like the 1-bit data streams and which are also included into the in-band noise in accordance with the output signal power differences of the individual digital to analog converters.

No algorithm on the outgoing circuit side, which generates a plurality of 1-bit data streams from the multibit signal and which, due to the restriction of reproducing a predefined multibit signal, only achieves sub-optimum noise shaping for each of these individual data streams, is now needed according to the invention with the proposed structure. Each individual 1-bit data signal is spectrally formed in an optimum manner and guarantees low in-band noise in the case of high mismatching.

The principle of noise signal suppression described above now makes it possible to improve the fundamental disadvantage of the sigma-delta modulator—the reduced in-band noise signal shaping—considerably over and above the amount achievable by the multibit sigma-delta D/A converter used up to now, as shown in the exemplary embodiment according to FIG. 2.

Figure 3:
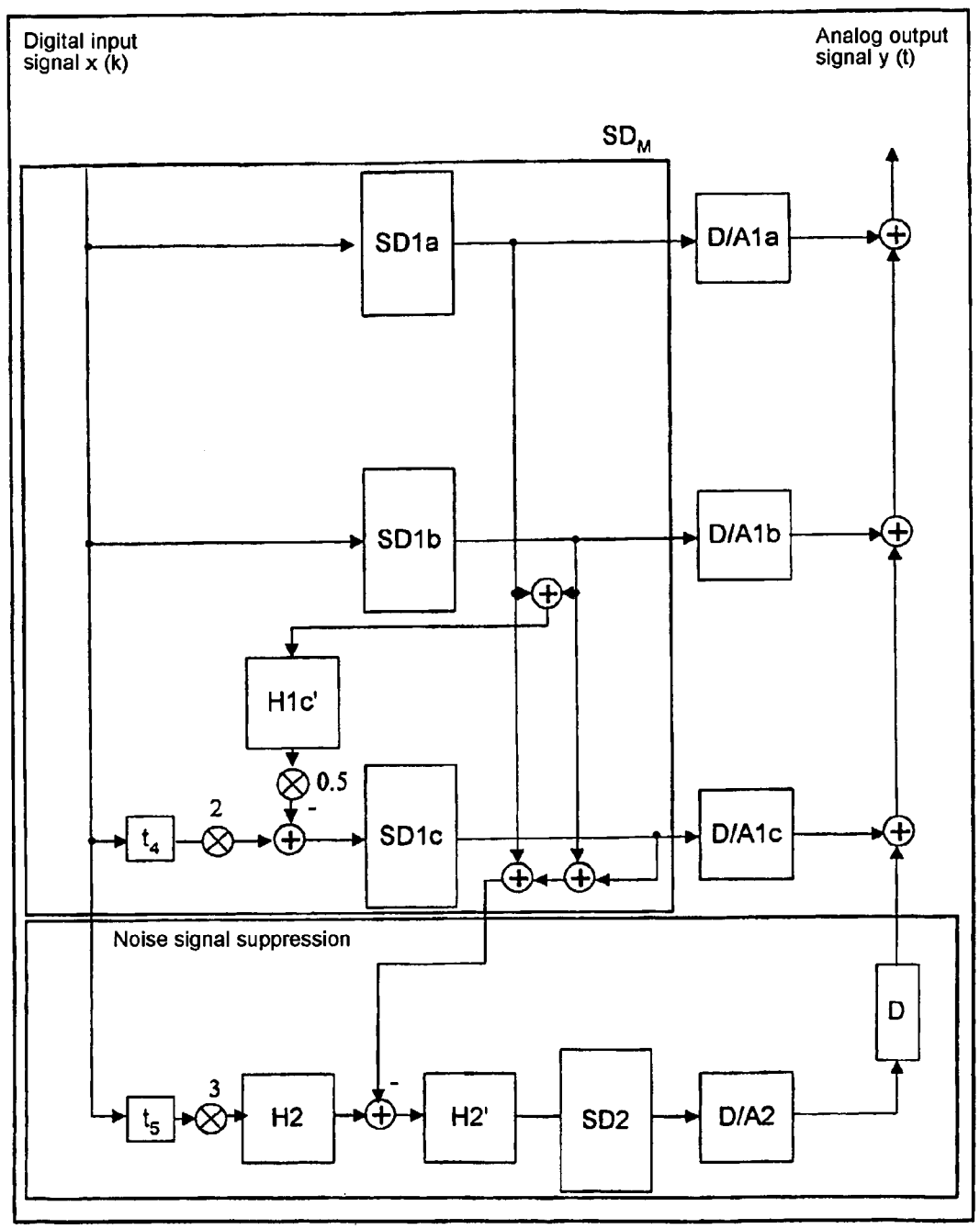
FIG. 3 is a block diagram of a sigma-delta converter with noise signal suppression with sigma-delta modulators with a linear-phase filter frequency range according to another embodiment of the invention.

The method of onward transfer of the sigma-delta noise in the D/A modulator shown in FIG. 2 merely represents a specific case. For example, in place of the delivery of the negative-signed noise of a sigma-delta modulator to the input of the next shown in FIG. 2, the negative-signed noise of a sigma-delta modulator can also be distributed over a plurality of sigma-delta modulators, as shown in FIG. 3. The advantage of this approach lies in the lowering of the noise power in the case of the least favorable possible combination. If the noise of the sigma-delta modulator SD1$a$ is designated as R1a for example, the noise of the individual sigma-delta modulators in FIG. 2 in the useful signal band constitutes:

| | |
|---|---|
| Noise ratio of SD1a to D/A1a: | R1a |
| Noise ratio of SD1b to D/A1b: | R1b-R1c |
| Noise ratio of SD1c to D/A1c: | R1c-R1b |
| Noise ratio of SD2 to D/A2: | R2-R1c |

If it is assumed that the individual digital to analog converters D/A1$a$, D/A1$b$, D/A1$c$, D/A2 vary in amplitude by the amount 1+/−d, then in the worst case, the sign of d is positive in the case of D/A1$a$, negative in the case of D/A1$b$, positive in the case of D/A1$c$ and negative again in the case of D/A2, with the result that the overall output signal noise $(1+d)*R1a+(1-d)*(R1b-R1a)+(1+d)*(R1c-R1b)+(1-d)*(R1c+R2)=R2+2*d*(R1a-R1b+R1c)$ is obtained for the multibit sigma-delta modulator with compensation of the noise. The first term R2 corresponds to the noise shaping sought and is greatly reduced in amplitude in accordance with the selected amplification. Since the noise signals of the individual sigma-delta modulators are independent of each other, their powers are added in a linear manner. In the case of equal noise power of the modulators therefore, $E\{R2*R2\}+12*E\{R1a*R1a\}$ is obtained as the overall in-band noise power, where $E\{\ \}$ designates the expected value. This noise power lies approx. 6 dB above the noise power of three sigma-delta modulators operating independently of each other.

Alternatives Represent

| | |
|---|---|
| Noise ratio of SD1a to D/A1a: | R1a |
| Noise ratio of SD1b to D/A1b: | R1b-0.5*R1a |
| Noise ratio of SD1c to D/A1c: | R1c-0.5*R1a-R1b |
| Noise ratio of SD2 to D/A2: | R2-R1c | with an overall noise power of $E\{R2*R2\}*\{1+d\}+9*E\{R1a*R1a\}$ and

| | |
|---|---|
| Noise ratio of SD1a to D/A1a: | R1a |
| Noise ratio of SD1b to D/A1b: | R1b |
| Noise ratio of SD1c to D/A1c: | R1c-0.5*R1a-0.5*R1b |
| Noise ratio of SD2 to D/A2: | R2-0.5*R1a-0.5*R1b-R1c | with an overall noise power of $E\{R2*R2\}*\{1+d\}+8*E\{R1a*R1a\}$.

The last variation is shown in FIG. 3. This also illustrates that in the case of a linear-phase filter frequency response with absolute frequency response 1 in the pass band, filtering of the useful signal can be omitted as a rule since this is normally already band-limited. A disadvantage in the case of this version, however, is the fact that the input level of SD2 increases and therefore, to prevent overdriving of the sigma-delta modulator, the gain of the noise compensation without mismatching turns out lower.

The structure of a sigma-delta modulator offers yet a further advantage. The power of the interference signal which has been designated as sigma-delta noise up to now is not spectrally shaped and distributed evenly over the frequency range as a rule. Interference lines arise in the frequency range in the case of certain signals, in which the noise power of the closer environment is concentrated. To largely suppress this effect, "dither" DI1a, DI1b, DI1c is added to sigma-delta modulators SD1a, SD1b, SD1c ("dither" is a stochastic signal) which is either added to the input signal of the sigma-delta modulator or is directly established in the decision of the sigma-delta modulator. The "dither" normally reduces the interference lines at the expense of the achievable signal-to-noise ratio of the modulator and is therefore severely limited in amplitude.

Figure 4:
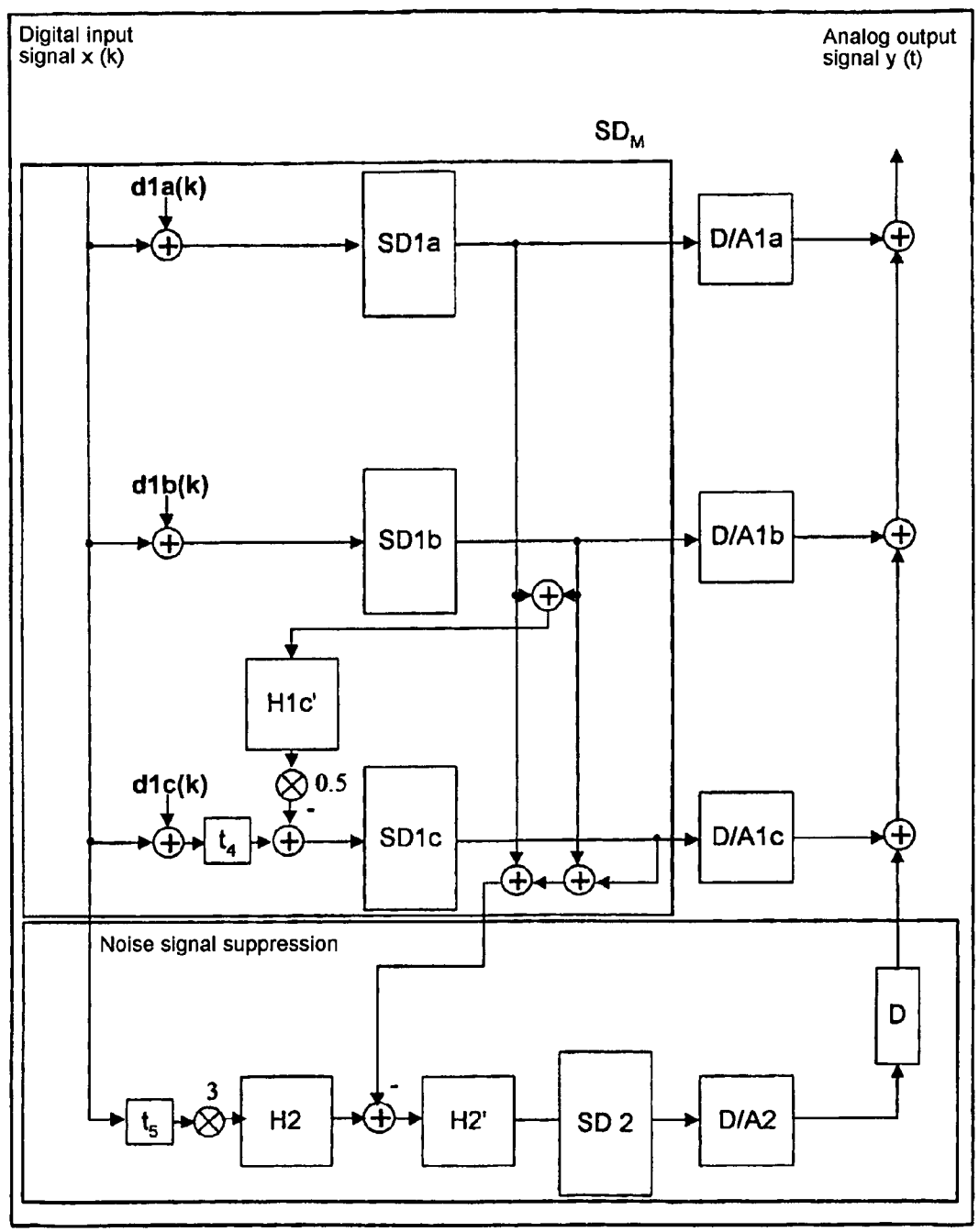
FIG. 4 is a block diagram of a sigma-delta converter with noise signal suppression according to a further embodiment of the invention, where uncorrelated and stochastic signals are added to the input signals of the principal and parallel paths.

The interference effect of the "dither" can now be caused to mutually compensate for itself by the plurality of coupled modulators of the compensating sigma-delta modulator. This is shown in FIG. 4 on the basis of the specific case from FIG. 3, by way of example. Different "dither" signals are added to the respective input signal for the three sigma-delta modulators SD1a, SD1b and SD1c. The fundamental aspect now is that the total of all "dither" signals cancels out, i.e. that no signal components of the "dither" are present any longer in the multibit signal to be generated.

An application example for "dither" constitutes $$DI1b(k)=-0.5*DI1a(k), DI1c(k)=0$$

SD1b compensates for half the dither DI1c of SD1a by the specific filter arrangement, while the rest is compensated for by SD1c. A problem in this respect, however, constitutes the behavior of the individual digital to analog converters in the case of mismatching. In the worst possible case (divergence +d, -d, -d), the interference effect of the power of the "dither" (16/9) is higher than that of three uncorrelated "dither" signals.

The generation of "dither" signals of this type can be achieved in the following manner:
1. Three random signals, which are statistically independent of each other, are generated DI1a(k), DI1b(k), DI1c(k)
2. The individual signals are distributed in such a way that each sigma-delta modulator receives the total of the positive random number of one random signal and two negative random numbers multiplied by the factor 0.5 in each case as "dither".

On the basis of the specific structure shown in FIG. 4, this means $$DI1a(k)=z1(k)-0.5*z2(k)-0.5*z3(k)$$

$$DI1b(k)=-0.5*z1(k)+z2(k)-0.5*z3(k)$$

$$DI1c(k)=0.$$

The invention has been described in detail with particular reference to preferred embodiments thereof and examples, but it will be understood that variations and modifications can be effected within the spirit and scope of the invention.

The invention claimed is:

1. A sigma-delta converter for converting a digital input signal into an analog output signal with noise suppression within a useful band, comprising:
a principal path including
at least one principal path sigma-delta modulator having a transmission function including a filter and having an output producing a digital output signal, and
at least one principal path digital-to-analog converter respectively coupled to the output of the at least one principal path sigma-delta modulator;
at least one parallel path connected in parallel with the principal path, each parallel path including
at least one parallel path sigma-delta modulator receiving a differential signal filtered to exclude at least noise components outside the useful band and obtained from the digital output signal of the principal path sigma-delta modulator and the input signal after spectral shaping by the filter according to the transmission function of the sigma-delta modulator in the principal path, and having an output, and
a parallel path digital-to-analog converter coupled to the output of the at least one parallel path sigma-delta modulator; and
an analog signal totaler, coupled to the principal path and the at least one parallel path, producing an analog output signal of the sigma-delta converter from analog output signals of the principal and parallel paths.

2. A sigma-delta converter as claimed in claim 1, wherein the at least one parallel path further includes an amplifier of the differential signal immediately before the at least one parallel path sigma-delta modulator.

3. A sigma-delta converter as claimed in claim 1, wherein the at least one parallel path further includes an attenuator attenuating the analog output signal between the parallel path digital-to-analog converter and before the analog signal totaler.

4. A sigma-delta converter as claimed in claim 3, wherein the at least one parallel path further includes a temporal delay of the input signal balancing out propagation time differences with respect to the principal path.

5. A sigma-delta converter as claimed in claim 4, wherein the principal path further includes compensation filtering after the input signal is branched to the parallel path and before the principal path digital-to-analog converter.

6. A sigma-delta converter as claimed in claim 5, wherein the principal path sigma-delta converter is a multi-stage sigma-delta converter.

7. A sigma-delta converter as claimed in claim 6, wherein the multi-stage sigma-delta converter in the principal path includes a direct path and at least one cascade stage in parallel to the direct path.

8. A sigma-delta converter as claimed in claim 7,
wherein the multi-stage sigma-delta converter in the principal path includes n cascade stages, where n>1, and for each cascade stage i for $2 \leq i \leq n$, an immediately prior cascade stage i−1 provides a principal stage path,
wherein each cascade stage i for $2 \leq i \leq n$ in the multi-stage sigma-delta converter includes a cascade stage sigma-delta modulator and an adder adding the input signal after the temporal delay to a noise-filtered signal of each prior cascade stage to produce an input for the cascade stage sigma-delta modulator, and
wherein said sigma-delta converter further comprises a digital signal totaler producing the digital output signal of the principal path by summing output signals of each cascade stage sigma-delta modulator in the multi-stage sigma-delta modulator.

9. A sigma-delta converter as claimed in claim 5, wherein each cascade stage sigma-delta modulators in the multi-stage sigma-delta converter in the principal path has a linear-phase frequency response with an absolute frequency response of 1.

10. A sigma-delta converter as claimed in claim 9, wherein the cascade stage sigma-delta modulator in cascade stage n has an input receiving the differential signal from the input signal and a noise-filtered and n-normalized total signal of the output signals of the cascade stage sigma-delta modulators in cascade stages i for 1<i<n−1.

11. A sigma-delta converter is claimed in claim 10, wherein the input of the cascade stage sigma-delta modulator of cascade stage n is multiplied by n.

12. A sigma-delta converter as claimed in claim 11, wherein the sigma-delta converter is a 1-bit sigma-delta converter.

13. A sigma-delta converter as claimed in claim 12, wherein the sigma-delta converter further comprises a 1-bit digital to analog converter possessing unequal output powers.

14. A sigma-delta converter as claimed in claim 13, wherein the cascade stage sigma-delta modulators of the multi-stage sigma-delta modulator have uncorrelated noise signals.

15. A sigma-delta converter as claimed in claim 14, further comprising at least one adder to add uncorrelated stochastic signals to the input of the cascade stage sigma-delta modulators of the multi-stage sigma-delta modulator.

16. A sigma-delta converter as claimed in claim 15, wherein the sigma-delta converter is manufactured in CMOS technology.

17. A radio communication reception device, comprising:
  a sigma-delta converter for converting a digital input signal into an analog output signal with noise suppression within a useful band, including
    a principal path including
      at least one principal path sigma-delta modulator having a transmission function including a filter and having an output producing a digital output signal, and
      at least one principal path digital-to-analog converter respectively coupled to the output of the at least one principal path sigma-delta modulator;
    at least one parallel path connected in parallel with the principal path, each parallel path including
      at least one parallel path sigma-delta modulator receiving a differential signal filtered to exclude at least noise components outside the useful band and obtained from the digital output signal of the principal path sigma-delta modulator and the input signal after spectral shaping by the filter according to the transmission function of the sigma-delta modulator in the principal path, and having an output, and
      a parallel path digital-to-analog converter respectively coupled to the output of the at least one parallel path sigma-delta modulator; and
    a signal totaler, coupled to the principal path and the at least one parallel path, producing an analog output signal of the sigma-delta converter from analog output signals of the principal and parallel paths.

* * * * *